United States Patent
Asuri et al.

(10) Patent No.: US 9,608,569 B2
(45) Date of Patent: Mar. 28, 2017

(54) LINEARIZING SCHEME FOR BASEBAND FILTER WITH ACTIVE FEEDBACK

(71) Applicant: QUALCOMM Incorporated, San Diego, CA (US)

(72) Inventors: Bhushan Shanti Asuri, San Diego, CA (US); Alok Prakash Joshi, Bangalore (IN); Gireesh Rajendran, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/806,334

(22) Filed: Jul. 22, 2015

(65) Prior Publication Data

US 2016/0294327 A1 Oct. 6, 2016

Related U.S. Application Data

(60) Provisional application No. 62/141,685, filed on Apr. 1, 2015.

(51) Int. Cl.
  *H03F 3/04* (2006.01)
  *H03F 1/02* (2006.01)
  *H03F 3/193* (2006.01)
  *H03F 1/32* (2006.01)
  (Continued)

(52) U.S. Cl.
  CPC ............ *H03F 1/0205* (2013.01); *H03C 3/08* (2013.01); *H03F 1/3205* (2013.01); *H03F 3/193* (2013.01); *H03F 2200/129* (2013.01); *H03F 2200/165* (2013.01); *H03F 2200/451* (2013.01); *H03F 2200/456* (2013.01); *H04B 1/30* (2013.01)

(58) Field of Classification Search
  CPC . H03F 3/04; H03F 3/343; H03F 3/345; H03F 2200/18; H03F 1/301; G05F 3/262
  USPC ........................................................ 330/288
  See application file for complete search history.

(56) References Cited

U.S. PATENT DOCUMENTS 4,462,001 A   7/1984 Girard
7,504,814 B2 * 3/2009 Lee .......................... G05F 1/575
                                                    323/281

(Continued)

FOREIGN PATENT DOCUMENTS

WO    2013189547 A1   12/2013

OTHER PUBLICATIONS

International Search Report and Written Opinion—PCT/US2016/021369—ISA/EPO—Jul. 4, 2016.

*Primary Examiner* — Khanh V Nguyen
(74) *Attorney, Agent, or Firm* — Arent Fox LLP

(57) ABSTRACT

A method and apparatus for linearizing a baseband filter are provided. The apparatus is configured to, via a first conducting module, receive a first current signal. The apparatus is further configured to, via a converting module, receive a second current signal, generate a voltage signal based on the second current signal, and apply the voltage signal to the first conducting module. An amount of the second current signal received by the converting module is based on an amount of the first current signal flowing through the first conducting module. The apparatus is also configured to, via a second conducting module, control an output current signal based on the voltage signal. The output current signal is controlled to be a linear replica of the first current signal for in-band frequencies.

30 Claims, 7 Drawing Sheets

(51) Int. Cl.
*H03C 3/08* (2006.01)
*H04B 1/30* (2006.01)

(56) References Cited

U.S. PATENT DOCUMENTS

| | | | | |
|---|---|---|---|---|
| 7,915,883 B2 * | 3/2011 | Chida | ................... | G05F 1/563 |
| | | | | 315/307 |
| 8,093,952 B2 * | 1/2012 | Behzad | .................. | H03F 1/301 |
| | | | | 330/285 |
| 8,219,049 B2 * | 7/2012 | Samavedam | ........... | H03F 1/301 |
| | | | | 330/130 |
| 8,918,070 B2 | 12/2014 | Shanan | | |
| 9,362,870 B2 * | 6/2016 | Lam | ......................... | H03F 3/19 |
| 2002/0109492 A1 * | 8/2002 | Bonelli | ................... | G05F 3/262 |
| | | | | 323/315 |
| 2011/0012678 A1 | 1/2011 | Kannan et al. | | |
| 2013/0137384 A1 | 5/2013 | Desclos et al. | | |
| 2013/0188755 A1 | 7/2013 | Lu et al. | | |
| 2013/0222054 A1 | 8/2013 | Yendluri et al. | | |
| 2014/0134960 A1 | 5/2014 | Tasic et al. | | |
| 2014/0194081 A1 | 7/2014 | Tohidian et al. | | |

\* cited by examiner

LINEARIZING SCHEME FOR BASEBAND FILTER WITH ACTIVE FEEDBACK

CROSS-REFERENCE TO RELATED APPLICATION(S)

This application claims the benefit of U.S. Provisional Application Ser. No. 62/141,685, entitled "LINEARIZING SCHEME FOR BASEBAND FILTER WITH ACTIVE FEEDBACK" and filed on Apr. 1, 2015, which is expressly incorporated by reference herein in its entirety.

BACKGROUND

Field

The present disclosure relates generally to communication systems, and more particularly, to an apparatus and method for linearizing a baseband filter.

Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, downconvert the received RF signal with a receive LO signal, and process the downconverted signal to recover data sent by the base station.

There is an increasing demand to have wireless devices capable of high-quality transmission and reception while consuming low power. One key to achieving high quality is associated with the performance of the device's transmitter. For example, it is desirable to have a transmitter that operates efficiently over its entire output power range.

In existing transmitter designs, a baseband (BB) filter and upconverter (mixer) are used to filter a baseband signal and up-convert the filtered signal to radio frequencies (RF) for transmission. Typically, both the baseband filter and upconverter are configured to operate across the entire output power range to meet stringent linearity requirements at maximum power. However, the existing transmitter designs that linearize the baseband filter may provide limited noise performance and/or power performance. Such existing transmitter designs may also inefficiently utilize a device area due to the use of modules/elements that consume a relatively large portion of device area. It is therefore desirable to have a more efficient scheme for linearizing the baseband filter for use in wireless devices.

SUMMARY

In an aspect of the disclosure, a method and apparatus for linearizing a baseband filter are provided. The apparatus is configured to, via a first conducting module, receive a first current signal. The apparatus is further configured to, via a converting module, receive a second current signal, generate a voltage signal based on the second current signal, and apply the voltage signal to the first conducting module. An amount of the second current signal received by the converting module is based on an amount of the first current signal flowing through the first conducting module. The apparatus is also configured to, via a second conducting module, control an output current signal based on the voltage signal. The output current signal is controlled to be a linear replica of the first current signal for in-band frequencies.

In another aspect, to linearize a baseband filter, a first current signal is received via a first conducting module. In addition, a second current signal is received via a converting module. Furthermore, a voltage signal based on the second current signal is generated and the voltage signal is applied to the first conducting module. An amount of the second current signal received by the converting module is based on an amount of the first current signal flowing through the first conducting module. The output current signal is controlled via a second conducting module. Furthermore, an output current signal is based on the voltage signal. The output current signal is controlled to be a linear replica of the first current signal for in-band frequencies.

In a further aspect, the apparatus for linearizing a baseband filter includes first conducting means for receiving a first current signal, converting means for receiving a second current signal, generating a voltage signal based on the second current signal, and applying the voltage signal to the first conducting means, wherein an amount of the second current signal received by the converting means is based on an amount of the first current signal flowing through the first conducting means, and second conducting means for controlling an output current signal based on the voltage signal, wherein the output current signal is controlled to be a linear replica of the first current signal for in-band frequencies.

DETAILED DESCRIPTION

Figure 1:
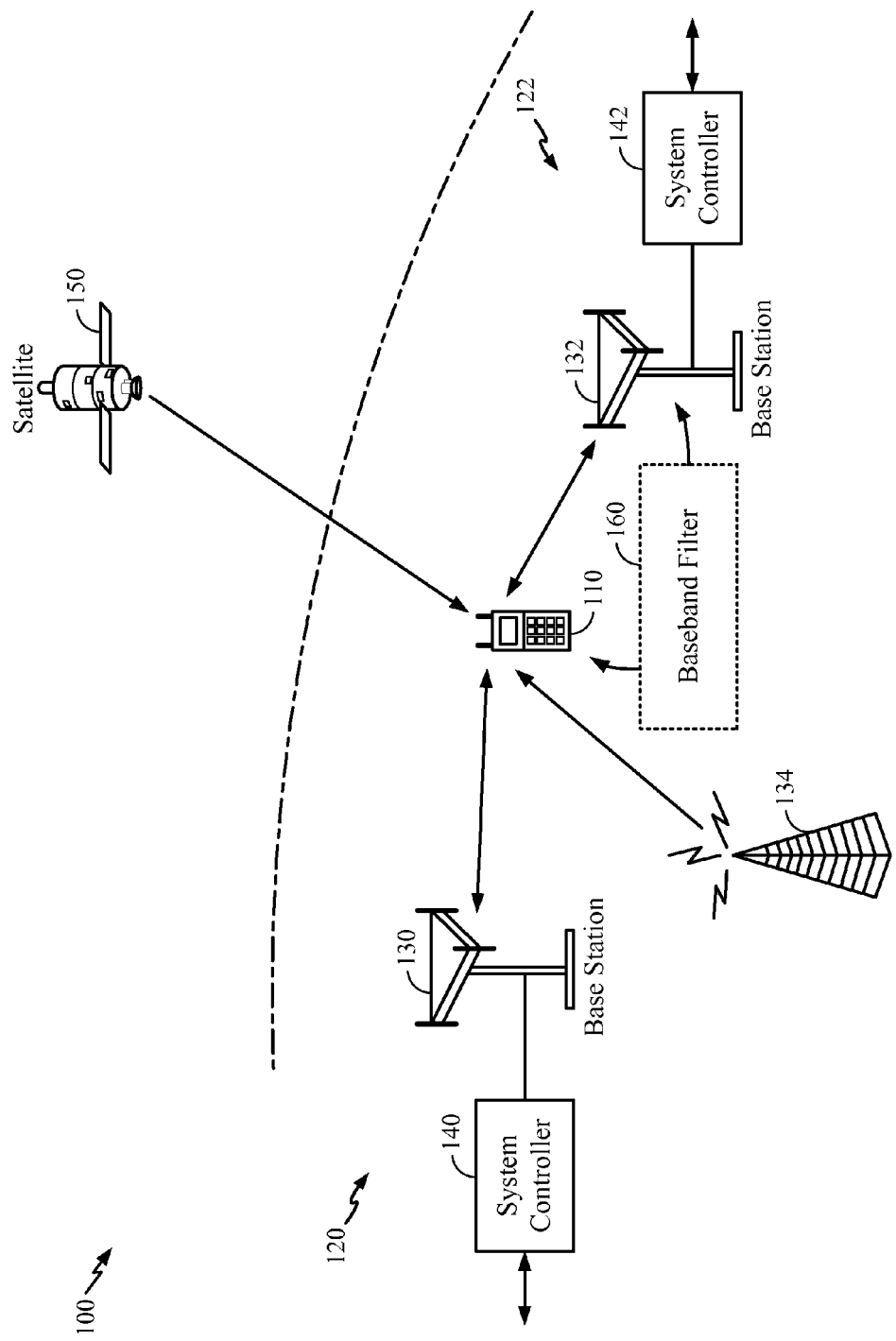
FIG. 1 illustrates a wireless device communicating with different wireless communication systems in accordance with some aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122 in accordance with some aspects of the present disclosure. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1× or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods.

For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE. The wireless device 110 and/or the base stations 130, 132 may include an exemplary baseband filter 160 that may include an apparatus for linearizing the baseband filter 160 as described herein. The apparatus for linearizing the baseband filter 160 may include a first conducting module configured to receive a first current signal. The apparatus for linearizing the baseband filter 160 may also include a converting module configured to receive a second current signal, generate a voltage signal based on the second current signal, and apply the voltage signal to the first conducting module, wherein an amount of the second current signal received by the converting module is based on an amount of the first current signal flowing through the first conducting module. Additionally, the apparatus for linearizing the baseband filter 160 may include a second conducting module configured to control an output current signal based on the voltage signal, wherein the output current signal is controlled to be a linear replica of the first current signal for in-band frequencies. In-band frequencies may include any set of frequencies within a defined telecommunications frequency band or channel. In some examples, in-band frequencies may include frequencies used for voice, data, or both. Control signaling may be sent using a different frequency band in some examples. Using one telecommunications frequency band for voice, data, or both and another telecommunications frequency band for control signaling may be referred to as out-of-band signaling. In some examples, in-band frequencies may include frequencies used for voice, data, and/or control signaling. Sending voice and/or data and control signals within the same telecommunications frequency band may be referred to as in-band signaling. Additionally, details of an exemplary baseband filter 160 are provided infra.

Figure 2:
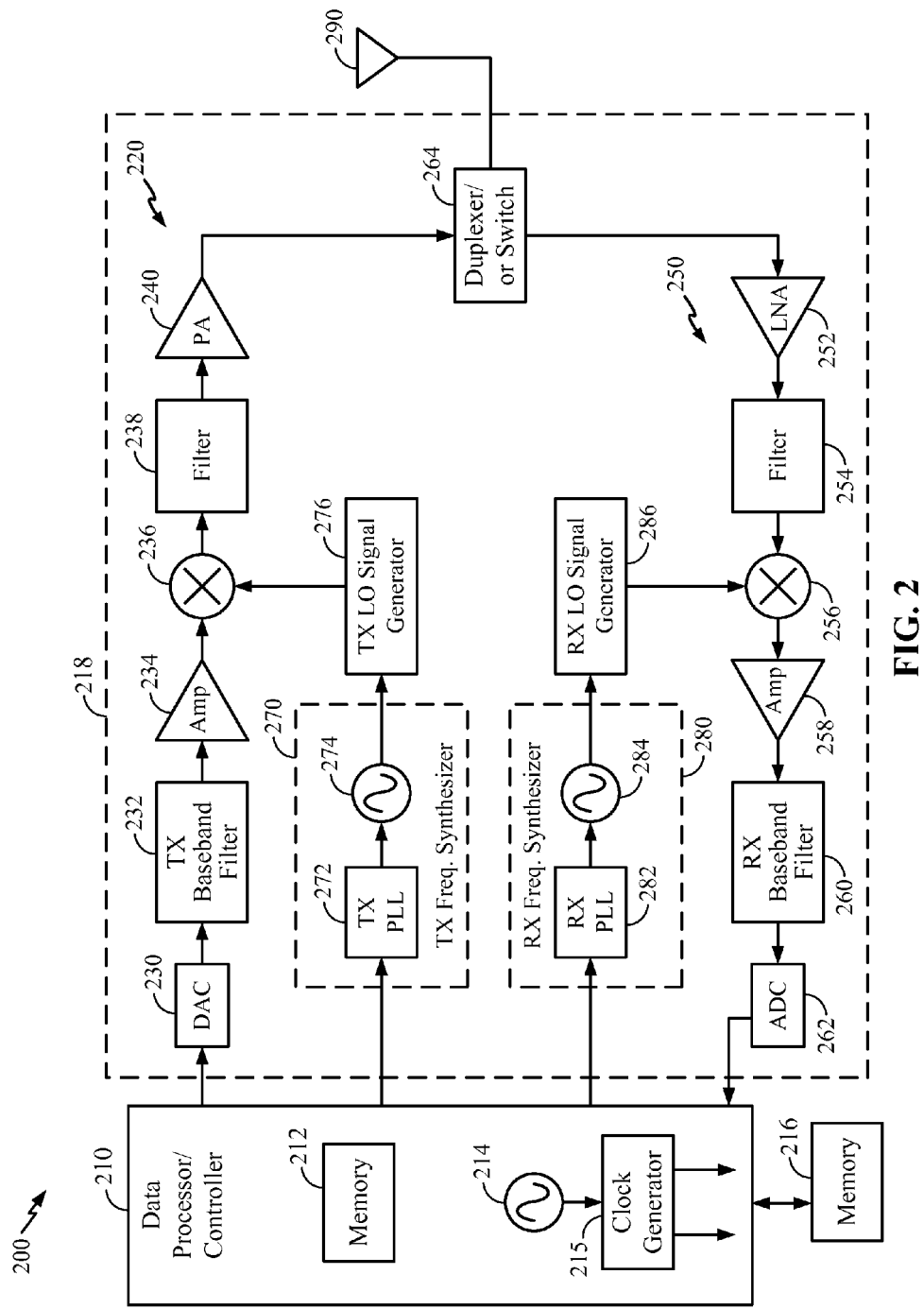
FIG. 2 is a block diagram of a wireless device in accordance with some aspects of the present disclosure.

FIG. 2 is a block diagram 200 of an exemplary wireless device, such as the wireless device 110 in accordance with some aspects of the present disclosure. The wireless device includes a data processor/controller 210, a transceiver 218, and an antenna 290. The data processor/controller 210 may be referred to as a processing system. A processing system may include the data processor/controller 210 or both the data processor/controller 210 and the memory 216. The transceiver 218 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. The baseband filter 232 may include an apparatus for linearizing a baseband filter as described herein. An amplifier (amp) 234 may amplify the signal from the TX baseband filter 232 and provide an amplified baseband signal. In an aspect, the exemplary baseband filter 160 may be implemented by one or more of the TX baseband filter 232 and the amplifier 234. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The baseband filter 260 may include an apparatus for linearizing a baseband filter as described herein. In an aspect, the exemplary baseband filter 160 may be implemented by one or more of the amplifier 258 and the RX baseband filter 260. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator 276 may generate a TX LO signal based on the TX VCO signal received from the TX frequency synthesizer 270.

An RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 215 may receive the VCO signal(s) from the oscillator 214 and may generate clock signals for various modules within the data processor/controller 210 and/or the transceiver 218. The data processor/controller 210 may be implemented on one or more application-specific integrated circuits (ASICs) and/or other ICs.

The present disclosure provides an apparatus and method for linearizing a baseband filter.

Figure 3:
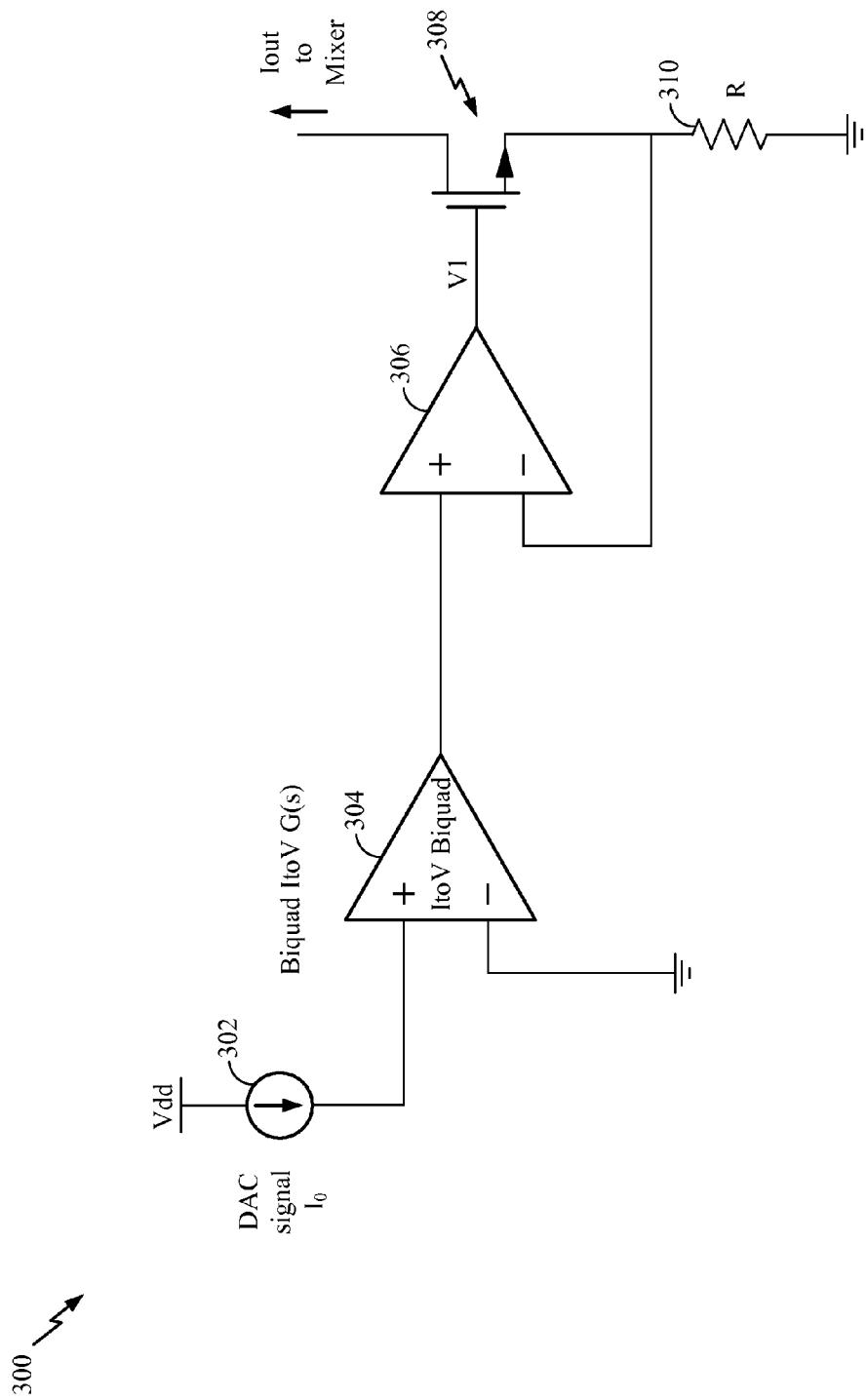
FIG. 3 illustrates an example of a baseband filter architecture.

FIG. 3 is a diagram 300 of an example of a baseband filter architecture. The baseband filter of FIG. 3 may include a current to voltage (ItoV) biquadratic (biquad) amplifier 304 configured to convert a current signal into a voltage signal, an operational amplifier (op-amp) 306, a transistor 308 (e.g. NMOS), and a resistor R 310. An inverting input of the ItoV biquad amplifier 304 is coupled to a ground node. A non-inverting input of the ItoV biquad amplifier 304 may receive a signal from a device module, such as a digital-to-analog converter (DAC). The signal may be a current signal or a voltage signal.

For example, the signal may be a DAC current signal $I_0$ represented as a voltage source Vdd and a current source 302 in FIG. 3. The ItoV biquad amplifier 304 may convert $I_0$ into a voltage signal, which may then be applied to a non-inverting input of the op-amp 306. The op-amp 306 amplifies the voltage signal and applies the amplified voltage signal V1 to a gate of the transistor 308.

The transistor 308 is configured to operate based on the amplified voltage signal V1. Accordingly, when the transistor 308 is in operation, an output current signal Iout flows between a drain and a source of the transistor 308. An amount of the output current signal Iout flowing through the transistor 308 is based on an amount of energy associated with Iout that is dissipated by the resistor R 310 coupled to the source of the transistor 308. An inverting input of the op-amp 306 is also coupled to the source of the transistor 308. The drain of the transistor 308 is coupled to a device module, such as a mixer. Accordingly, Iout may be applied to such device module.

Due to the output current of the op-amp 306 being V1/R, Iout=$G(s)*I_0/R$. The example baseband filter architecture of FIG. 3 may be area and power inefficient due to the existence of the op-amp 306, which utilizes a relatively large device area and consumes a relatively large amount of power. Additionally, the baseband filter architecture of FIG. 3 may have limited noise performance due to the linearization of the op-amp 306.

Figure 4:
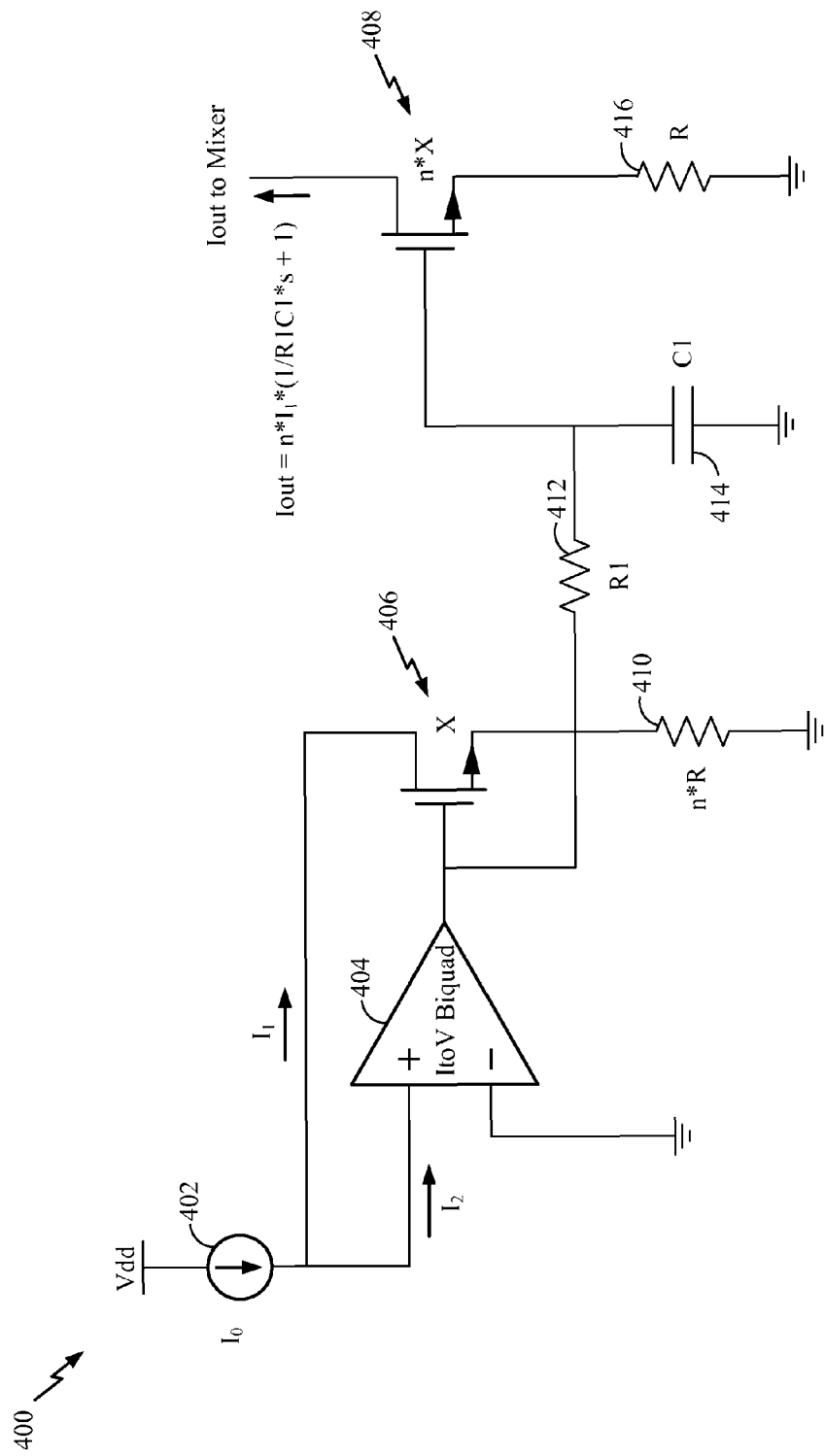
FIG. 4 illustrates another example of a baseband filter architecture.

FIG. 4 is a diagram 400 of another example of a baseband filter architecture. The baseband filter of FIG. 4 may include an ItoV biquad amplifier 404 configured to convert a current signal into a voltage signal, a first transistor 406 (e.g. NMOS), a first resistor 410, a second resistor 412, a capacitor 414, a third resistor 416, and a second transistor 408.

An input signal from a device module, such as a digital-to-analog converter (DAC), may be applied to the baseband filter. The signal may be a current signal or a voltage signal. For example, the signal may be a DAC current signal $I_0$ represented as a voltage source Vdd and a current source 402 in FIG. 4. A drain of the first transistor 406 may receive a current signal $I_1$ based on $I_0$. A non-inverting input of the ItoV biquad amplifier 404 may receive a current signal $I_2$ based on $I_0$. An inverting input of the ItoV biquad amplifier 404 is coupled to a ground node.

The ItoV biquad amplifier 404 may convert $I_2$ into a voltage signal, which may then be applied to a gate of the first transistor 406. The first transistor 406 is configured to operate based on the voltage signal from ItoV biquad amplifier 404. Accordingly, when the first transistor 406 is in operation, the first transistor 406 flows the current signal $I_1$ from the drain to a source of the first transistor 406 toward the first resistor 410. An amount of the current signal $I_1$ flowing through the transistor 406 is based on an amount of energy associated with $I_1$ that is dissipated by the first resistor 410 coupled to the source of the first transistor 406. In an aspect, the amount of the current signal $I_1$ flowing through the first transistor 406 may reduce or increase the amount of the current signal I₂ received by the ItoV biquad amplifier 404.

The voltage signal from the ItoV biquad amplifier 404 may further flow through the second resistor 412 to be applied to a gate of the second transistor 408. The amount of the voltage signal at the gate of the second transistor 408 is based on an amount of energy associated with the voltage signal dissipated by the second resistor 412 and the amount of energy associated with the voltage signal stored by the capacitor 414 after the dissipation.

The second transistor 408 is configured to operate based on the voltage signal applied to the gate. Accordingly, when the second transistor 408 is in operation, the second transistor 408 flows an output current signal Iout between a drain and a source of the second transistor 408. An amount of the output current signal Iout flowing through the second transistor 408 is based on an amount of energy associated with Iout that is dissipated by the third resistor 416 coupled to the source of the second transistor 408. The drain of the second transistor 408 is coupled to a device module, such as a mixer. Accordingly, Iout may be applied to such device module.

In an aspect, a size of the second transistor 408 is a multiple of the first transistor 406. For example, the first transistor 406 may have a size X, wherein X is 10, 20, or other value. Accordingly, the second transistor 408 may have a size n*X, wherein n is a real number.

In another aspect, a value of the first resistor 410 is a multiple of the third resistor 416. For example, the third resistor 416 may have a value of R. Accordingly, the first resistor 410 may have a value of n*R, wherein n is a real number.

In the baseband filter architecture of FIG. 4, the DAC current signal I₀ is replicated to a mixer input. Due to the feedback amplifier around the first transistor 406, Iout is a linear replica of I₁ for in-band frequencies, wherein Iout=n*I₁*(1/(R1C1*s+1)). Noise performance is improved due to the use of fewer stages and an R1C1 passive pole. Area and power consumption is also reduced as compared to the baseband filter architecture of FIG. 3. However, the baseband filter architecture of FIG. 4 may experience a tradeoff between out-of-band rejection and achievable distortion levels as the architecture linearizes Iout by replicating the DAC current signal I₀. Also, the filter bandwidth and R1C1 may limit the distortion levels achieved.

Figure 5:
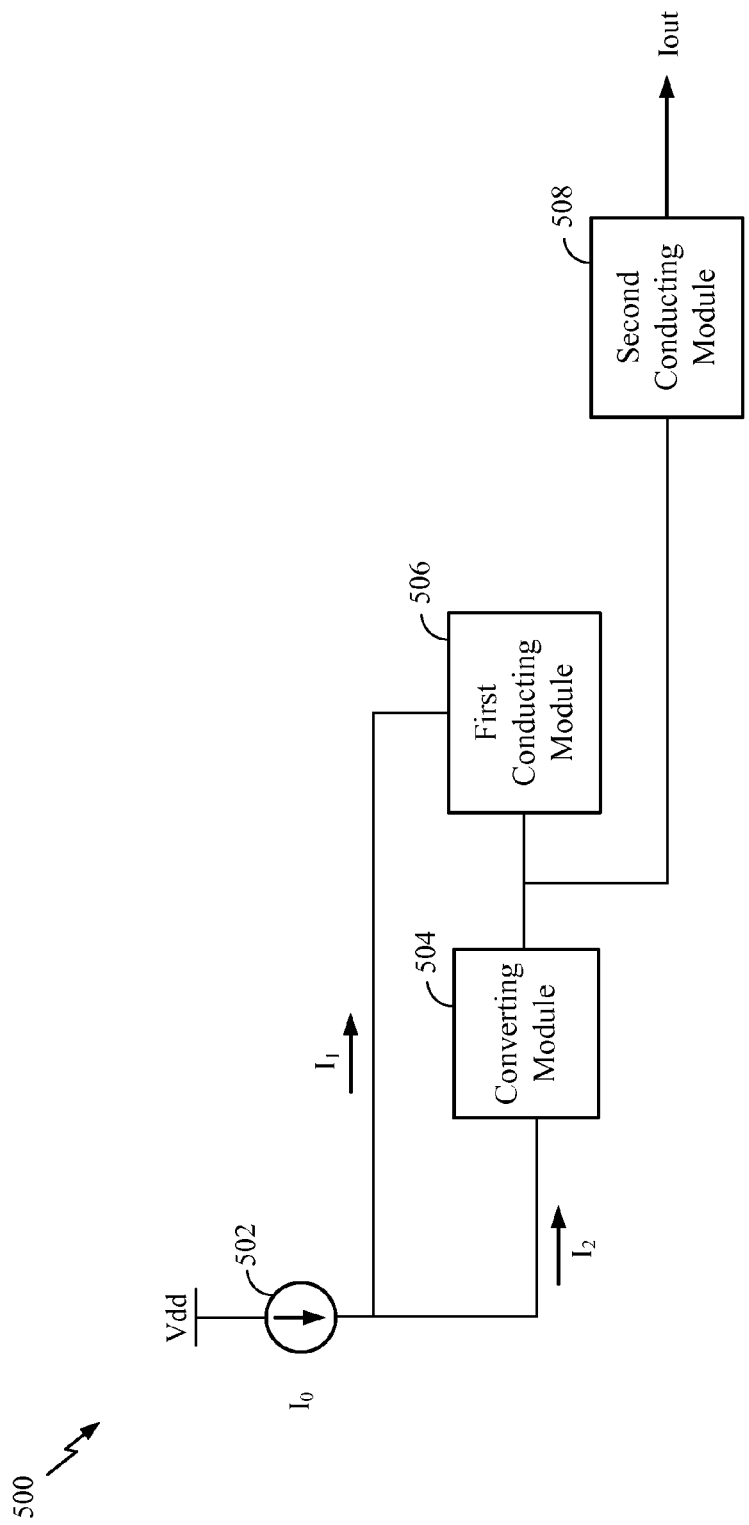
FIG. 5 is a block diagram of an apparatus for linearizing a baseband filter using active feedback in accordance with some aspects of the present disclosure.

FIG. 5 is a block diagram 500 of an apparatus for linearizing a baseband filter using active feedback in accordance with some aspects of the present disclosure. The apparatus (e.g., baseband filter) may include a converting module 504, a first conducting module 506, and a second conducting module 508. An input signal from a device module, such as a digital-to-analog converter (DAC), may be applied to the apparatus. The signal may be a current signal or a voltage signal. For example, the signal may be a DAC current signal I₀ represented as a voltage source Vdd and a current source 502 in FIG. 5.

The first conducting module is configured to receive a first current signal I₁ based on I₀. The converting module 504 is configured to receive a second current signal I₂ based on I₀. The converting module 504 is further configured to generate a voltage signal based on the second current signal I₂ and apply the voltage signal to the first conducting module 506. An amount of the second current signal I₂ received by the converting module 504 is based on an amount of the first current signal I₁ flowing through the first conducting module 506. The second conducting module 508 is configured to control an output current signal Iout based on the voltage signal. The output current signal Iout is controlled to be a linear replica of the first current signal I₁ for in-band frequencies.

Figure 6:
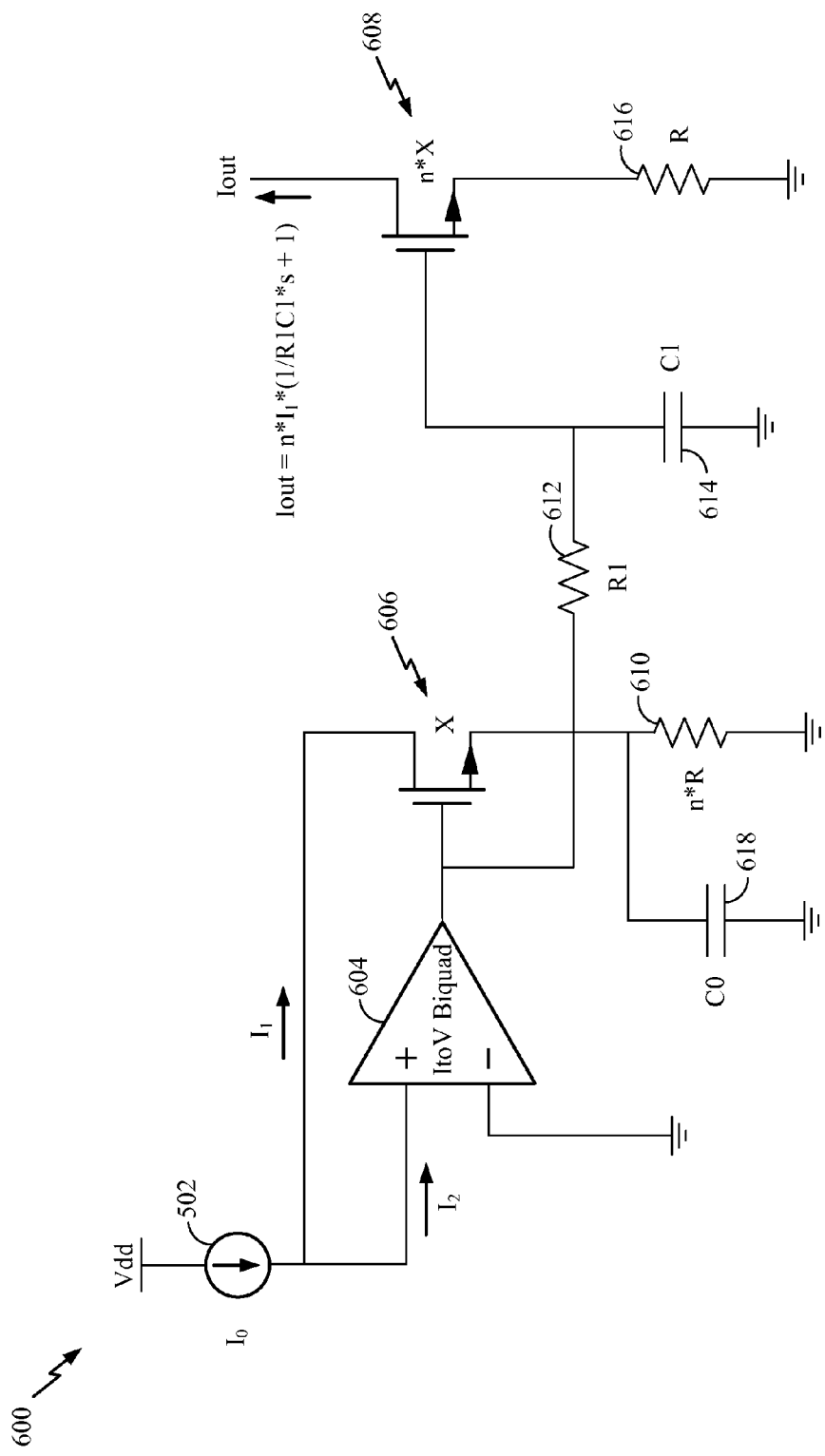
FIG. 6 is a circuit diagram of the apparatus of FIG. 5 for linearizing a baseband filter using active feedback in accordance with some aspects of the present disclosure.

FIG. 6 is a circuit diagram 600 of the apparatus of FIG. 5 for linearizing a baseband filter using active feedback in accordance with some aspects of the present disclosure. Referring to FIGS. 5 and 6, the converting module 504 includes a biquad amplifier 604 and the first conducting module 506 includes a first capacitor 618, a first resistor 610, and a first transistor (e.g., NMOS) 606 configured to operate based on a voltage signal from the biquad amplifier 604.

A non-inverting input of the biquad amplifier 604 is coupled to the current source 502. A drain of the first transistor 606 is coupled to the current source 502. A gate of the first transistor 606 is coupled to an output of the biquad amplifier 604. A source of the first transistor 606 is coupled to a first node of the first capacitor 618 and a first node of the first resistor 610. A second node of the first capacitor 618 and a second node of the first resistor 610 are coupled to a ground node.

The first transistor 606 is configured to operate based on the voltage signal from the biquad amplifier 604. Accordingly, when the first transistor 606 operates, the first transistor 606 is configured to flow the first current signal I₁ from the drain to the source of the first transistor 606 toward the first capacitor 618 and the first resistor 610. The amount of the first current signal I₁ flowing through the first transistor 606 is based on an amount of energy associated with the first current signal I₁ stored by the first capacitor 618 and the amount of energy associated with the first current signal I₁ dissipated by the first resistor 610. At a high frequency, the amount of the first current signal I₁ flowing through the first transistor 606 reduces the amount of the second current signal I₂ received by the biquad amplifier 604. A high frequency may be relative to the particular communication frequency band used, e.g., relative to in-band frequencies. As described above, in-band frequencies may include any set of frequencies within a defined telecommunications frequency band or channel. In some examples, in-band frequencies may include frequencies used for voice, data, or both. In other examples, in-band frequencies may include frequencies used for voice and/or data and control signaling. A high frequency may be, for example, any frequency higher than the highest frequency of the particular set of frequencies within a defined telecommunications frequency band or channel.

Still referring to FIGS. 5 and 6, the second conducting module 508 comprises a second resistor 612, a second capacitor 614, a third resistor 616, and a second transistor 608. A first node of the second resistor 612 is coupled to the output of the biquad amplifier 604 and the gate of the first transistor 606. A second node of the second resistor 612 is coupled to a first node of the second capacitor 614 and a gate of the second transistor 608.

The first node of the second capacitor 614 is coupled to the second node of the second resistor 612 and the gate of the second transistor 608. A second node of the second capacitor 614 is coupled to the ground node.

A first node of the third resistor 616 is coupled to a source of the second transistor 608. A second node of the third resistor 616 is coupled to the ground node.

The source of the second transistor 608 is coupled to the first node of the third resistor 616, and the output current signal Iout flows through a drain of the second transistor 608. The drain of the second transistor 608 is coupled to a device module, such as a mixer. Accordingly, Iout may be applied to such device module.

In an aspect, the output current signal Iout is controlled to be the linear replica of the first current signal $I_1$ based on the biquad amplifier 604 flowing the voltage signal across the second resistor 612 to be applied to the gate of the second transistor 608. The second transistor 608 is configured to operate based on the voltage signal applied to the gate. Accordingly, when the second transistor 608 operates, the second transistor 608 flows the output current signal Iout between the drain and the source of the second transistor 608.

An amount of the voltage signal at the gate of the second transistor 608 is based on an amount of energy associated with the voltage signal dissipated by the second resistor 612 and the amount of energy associated with the voltage signal stored by the second capacitor 614 after the dissipation. The amount of the output current signal Iout flowing through the second transistor 608 is based on an amount of energy associated with the output current signal Iout dissipated by the third resistor 616.

In an aspect, a size of the second transistor 608 is a multiple of the first transistor 606. For example, the first transistor 606 may have a size X, wherein X is 10, 20, or other value. Accordingly, the second transistor 608 may have a size n*X, wherein n is a real number.

In another aspect, a value of the first resistor 610 is a multiple of the third resistor 616. For example, the third resistor 616 may have a value of R. Accordingly, the first resistor 610 may have a value of n*R, wherein n is a real number.

In the baseband filter architecture of FIGS. 5 and 6, the DAC current signal $I_0$ is replicated to a mixer input. Iout is a linear replica of $I_1$ for in-band frequencies, wherein Iout=n*$I_1$*(1/(R1C1*s+1)). By use of the first capacitor C0 618 in the architecture, a current carried by the biquad amplifier 604 is reduced at high frequencies. Accordingly, a distortion current at a GM stage does not drop with frequency and hence 4FMOD power is not degraded. Compared to the baseband filter architecture of FIG. 4, the baseband filter architecture of FIGS. 5 and 6 provide improved out-of-band rejection and 4FMOD power.

Figure 7:
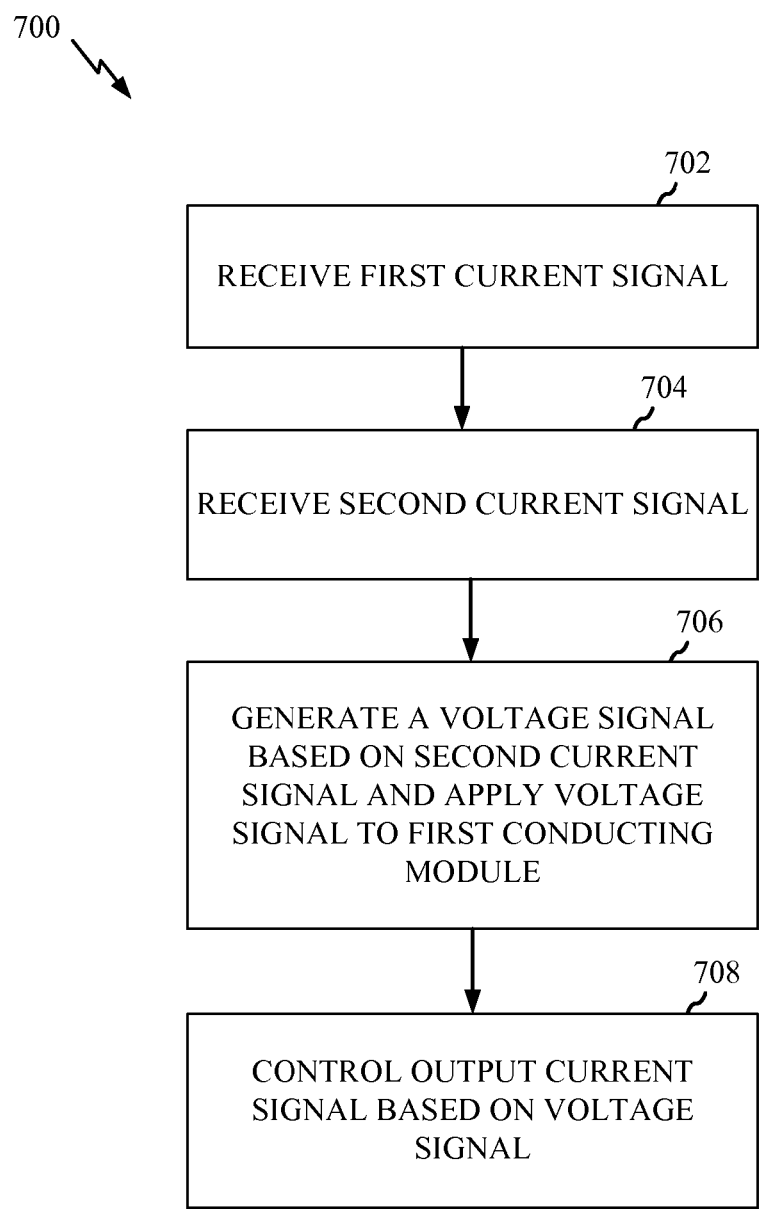
FIG. 7 is a flowchart of a method for linearizing a baseband filter in accordance with some aspects of the present disclosure.

FIG. 7 is a flowchart of a method for linearizing a baseband filter in accordance with some aspects of the present disclosure. The method may be performed by an apparatus (e.g., baseband filter 160 or baseband filter of FIGS. 5 and 6).

At block 702, the apparatus receives a first current signal via a first conducting module (e.g., first conducting module 506). In one example, the first conducting module includes a first capacitor (e.g., first capacitor 618), a first resistor (e.g., first resistor 610), and a first transistor (e.g., first transistor 606) configured to operate based on the voltage signal from the biquad amplifier.

At block 704, the apparatus receives a second current signal via a converting module (e.g. converting module 504). In one example, the converting module includes a biquad amplifier (e.g. biquad amplifier 604). A non-inverting input of the biquad amplifier is coupled to a current source (e.g., current source 502). A drain of the first transistor is coupled to the current source, a gate of the first transistor is coupled to an output of the biquad amplifier, and a source of the first transistor is coupled to a first node of the first capacitor and a first node of the first resistor. A second node of the first capacitor and a second node of the first resistor are coupled to a ground node.

When the first transistor operates based on the voltage signal from the biquad amplifier, the first transistor flows the first current signal from the drain to the source of the first transistor toward the first capacitor and the first resistor. The amount of the first current signal flowing through the first transistor is based on an amount of energy associated with the first current signal stored by the first capacitor and the amount of energy associated with the first current signal dissipated by the first resistor. At a high frequency, the amount of the first current signal flowing through the first transistor reduces the amount of the second current signal received by the biquad amplifier.

At block 706, the apparatus generates, via the converting module (e.g., converting module 504), a voltage signal based on the second current signal and applies the voltage signal to the first conducting module. An amount of the second current signal received by the converting module is based on an amount of the first current signal flowing through the first conducting module. Referring to FIGS. 5 and 6, the converting module 504 includes a biquad amplifier 604. A non-inverting input of the biquad amplifier 604 is coupled to the current source 502.

At block 708, the apparatus controls, via a second conducting module (e.g., second conducting module 508), an output current signal based on the voltage signal, wherein the output current signal is controlled to be a linear replica of the first current signal for in-band frequencies. In an example, the second conducting module includes a second resistor (e.g., second resistor 612), a second capacitor (e.g., second capacitor 614), a third resistor (e.g., third resistor 616, and a second transistor (e.g., second transistor 608). A first node of the second resistor is coupled to the output of the biquad amplifier and the gate of the first transistor. A second node of the second resistor is coupled to a first node of the second capacitor and a gate of the second transistor. The first node of the second capacitor is coupled to the second node of the second resistor and the gate of the second transistor. A second node of the second capacitor is coupled to the ground node. A first node of the third resistor is coupled to a source of the second transistor. A second node of the third resistor is coupled to the ground node. The source of the second transistor is coupled to the first node of the third resistor. The output current signal flows through a drain of the second transistor. In an aspect, the output current signal is controlled to be the linear replica of the first current signal by flowing the voltage signal from the biquad amplifier across the second resistor to be applied to the gate of the second transistor, and operating the second transistor based on the voltage signal applied to the gate of the second transistor and flowing the output current signal between the drain and the source of the second transistor. An amount of the voltage signal at the gate of the second transistor is based on an amount of energy associated with the voltage signal dissipated by the second resistor and the amount of energy associated with the voltage signal stored by the second capacitor after the dissipation. The amount of the output current signal flowing through the second transistor is based on an amount of energy associated with the output current signal dissipated by the third resistor.

In a further aspect, a size of the second transistor is n times a size of the first transistor, where n is a real number. Moreover, a value of the first resistor is n times a value of the third resistor, where n is a real number.

Referring again to FIGS. 5 and 6, an apparatus (e.g., baseband filter 160) may include one or more of the converting module 504, the first conducting module 506, and the second conducting module 508, and the circuit elements described above corresponding to the respective modules. The apparatus includes first conducting means for receiving a first current signal. The apparatus further includes converting means for receiving a second current signal, generating a voltage signal based on the second current signal, and applying the voltage signal to the first conducting means. An amount of the second current signal received by the converting means is based on an amount of the first current signal flowing through the first conducting means. The apparatus also includes second conducting means for controlling an output current signal based on the voltage signal. The output current signal is controlled to be a linear replica of the first current signal for in-band frequencies. The aforementioned means may be one or more of one or more of the converting module 504, the first conducting module 506, the second conducting module 508, the circuit elements corresponding to the respective modules, the data processor/controller 210, the computer-readable medium, i.e., the memory 212, and/or the computer-readable medium, i.e., the memory 216 configured to perform the functions recited by the aforementioned means.

Referring back to FIG. 5, the apparatus for linearizing a baseband filter using active feedback may implement the method illustrated in FIG. 7. FIG. 5 also provides a conceptual data flow diagram illustrating the data flow between different modules/means/components in the exemplary apparatus. The apparatus may be a baseband filter, part of a base band filter, a baseband filter linearizer, or part of control circuitry related to the baseband filter. In some examples, a baseband filter including the apparatus may be a sub-part of a wireless device such as the wireless device 200 of FIG. 2, a UE or a base station such as an eNB. As described above, the example apparatus includes a converting module 504 that is configured to receive a first current signal (block 702 of FIG. 7). The example apparatus further includes a first conducting module 506 that is configured to receive a second current signal (block 704 of FIG. 7). The first conducting module 506 generates a voltage signal based on the second current signal and applies the voltage signal to the first conducting module (block 706 of FIG. 7). An amount of the second current signal received by the converting module 504 may be based on an amount of the first current signal flowing through the first conducting module 506. The example apparatus also includes a second conducting module 508 that is configured to control an output current signal based on the voltage signal (block 708 of FIG. 7). In some examples, the output current signal is controlled to be a linear replica of the first current signal for in-band frequencies.

The apparatus may include additional modules that perform each of the blocks of the algorithm in the aforementioned flowcharts of FIG. 7. As such, each block in the aforementioned flowcharts of FIG. 7 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

In some examples, a first conducting means for receiving a first current signal may include the first conducting module 506 of FIG. 5. In other examples, the first conducting means may include the first capacitor 618, the first resistor 610, and the first transistor 606 of FIG. 6 configured to operate based on the voltage signal from the biquad amplifier.

In some examples, a converting means for receiving a second current signal, generating a voltage signal based on the second current signal, and applying the voltage signal to the first conducting means may include the converting module 504 of FIG. 5. In other examples, the converting means may include a biquad amplifier 604 of FIG. 6. A non-inverting input of the biquad amplifier is coupled to a current source 502. A drain of the first transistor is coupled to the current source, a gate of the first transistor is coupled to an output of the biquad amplifier, and a source of the first transistor is coupled to a first node of the first capacitor and a first node of the first resistor. A second node of the first capacitor and a second node of the first resistor are coupled to a ground node.

In some examples, a second conducting means for controlling an output current signal based on the voltage signal may include the second conducting module 508 of FIG. 5. In other examples, the second conducting module includes a second resistor (e.g., second resistor 612), a second capacitor (e.g., second capacitor 614), a third resistor (e.g., third resistor 616, and a second transistor (e.g., second transistor 608).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for linearizing a baseband filter, comprising:
   a first conducting module configured to receive a first current signal;
   a converting module configured to receive a second current signal, generate a voltage signal based on the second current signal, and apply the voltage signal to the first conducting module, wherein an amount of the second current signal received by the converting module is based on an amount of the first current signal flowing through the first conducting module; and
   a second conducting module configured to control an output current signal based on the voltage signal, wherein the output current signal is controlled to be a linear replica of the first current signal for in-band frequencies.

2. The apparatus of claim 1, wherein the converting module comprises a biquadratic amplifier and the first conducting module comprises a first capacitor, a first resistor, and a first transistor configured to operate based on the voltage signal from the biquadratic amplifier,
- wherein a non-inverting input of the biquadratic amplifier is coupled to a current source,
- wherein a drain of the first transistor is coupled to the current source, a gate of the first transistor is coupled to an output of the biquadratic amplifier, and a source of the first transistor is coupled to a first node of the first capacitor and a first node of the first resistor, and
- wherein a second node of the first capacitor and a second node of the first resistor are coupled to a ground node.

3. The apparatus of claim 2, wherein when the first transistor is configured to operate based on the voltage signal from the biquadratic amplifier, the first transistor is configured to flow the first current signal from the drain to the source of the first transistor toward the first capacitor and the first resistor, and wherein the amount of the first current signal flowing through the first transistor is based on an amount of energy associated with the first current signal stored by the first capacitor and an amount of energy associated with the first current signal dissipated by the first resistor.

4. The apparatus of claim 3, wherein, at a frequency higher than a highest in-band frequency, the amount of the first current signal flowing through the first transistor reduces the amount of the second current signal received by the biquadratic amplifier.

5. The apparatus of claim 2, wherein the second conducting module comprises a second resistor, a second capacitor, a third resistor, and a second transistor,
- wherein a first node of the second resistor is coupled to the output of the biquadratic amplifier and the gate of the first transistor, and a second node of the second resistor is coupled to a first node of the second capacitor and a gate of the second transistor,
- wherein the first node of the second capacitor is coupled to the second node of the second resistor and the gate of the second transistor, and a second node of the second capacitor is coupled to the ground node,
- wherein a first node of the third resistor is coupled to a source of the second transistor, and a second node of the third resistor is coupled to the ground node,
- wherein the source of the second transistor is coupled to the first node of the third resistor, and
- wherein the output current signal flows through a drain of the second transistor.

6. The apparatus of claim 5, wherein the output current signal is controlled to be the linear replica of the first current signal by:
- the biquadratic amplifier flowing the voltage signal across the second resistor to be applied to the gate of the second transistor, and
- the second transistor operating based on the voltage signal applied to the gate of the second transistor and flowing the output current signal between the drain and the source of the second transistor.

7. The apparatus of claim 6, wherein an amount of the voltage signal at the gate of the second transistor is based on an amount of energy associated with the voltage signal dissipated by the second resistor and an amount of energy associated with the voltage signal stored by the second capacitor after the dissipation.

8. The apparatus of claim 6, wherein the amount of the output current signal flowing through the second transistor is based on an amount of energy associated with the output current signal dissipated by the third resistor.

9. The apparatus of claim 5, wherein a size of the second transistor is n times a size of the first transistor, where n is a real number.

10. The apparatus of claim 5, wherein a value of the first resistor is n times a value of the third resistor, wherein n is a real number.

11. A method for linearizing a baseband filter, comprising:
- receiving a first current signal via a first conducting module;
- receiving a second current signal via a converting module,
- generating, via the converting module, a voltage signal based on the second current signal and applying the voltage signal to the first conducting module, wherein an amount of the second current signal received by the converting module is based on an amount of the first current signal flowing through the first conducting module; and
- controlling, via a second conducting module, an output current signal based on the voltage signal, wherein the output current signal is controlled to be a linear replica of the first current signal for in-band frequencies.

12. The method of claim 11, wherein the converting module comprises a biquadratic amplifier and the first conducting module comprises a first capacitor, a first resistor, and a first transistor configured to operate based on the voltage signal from the biquadratic amplifier,
- wherein a non-inverting input of the biquadratic amplifier is coupled to a current source,
- wherein a drain of the first transistor is coupled to the current source, a gate of the first transistor is coupled to an output of the biquadratic amplifier, and a source of the first transistor is coupled to a first node of the first capacitor and a first node of the first resistor, and
- wherein a second node of the first capacitor and a second node of the first resistor are coupled to a ground node.

13. The method of claim 12, wherein when the first transistor operates based on the voltage signal from the biquadratic amplifier, the first transistor flows the first current signal from the drain to the source of the first transistor toward the first capacitor and the first resistor, and
- wherein the amount of the first current signal flowing through the first transistor is based on an amount of energy associated with the first current signal stored by the first capacitor and an amount of energy associated with the first current signal dissipated by the first resistor.

14. The method of claim 13, wherein, at a frequency higher than a highest in-band frequency, the amount of the first current signal flowing through the first transistor reduces the amount of the second current signal received by the biquadratic amplifier.

15. The method of claim 12, wherein the second conducting module comprises a second resistor, a second capacitor, a third resistor, and a second transistor,
- wherein a first node of the second resistor is coupled to the output of the biquadratic amplifier and the gate of the first transistor, and a second node of the second resistor is coupled to a first node of the second capacitor and a gate of the second transistor,
- wherein the first node of the second capacitor is coupled to the second node of the second resistor and the gate of the second transistor, and a second node of the second capacitor is coupled to the ground node, wherein a first node of the third resistor is coupled to a source of the second transistor, and a second node of the third resistor is coupled to the ground node, wherein the source of the second transistor is coupled to the first node of the third resistor, and wherein the output current signal flows through a drain of the second transistor.

16. The method of claim 15, wherein the output current signal is controlled to be the linear replica of the first current signal by:

flowing the voltage signal from the biquadratic amplifier across the second resistor to be applied to the gate of the second transistor, and operating the second transistor based on the voltage signal applied to the gate of the second transistor and flowing the output current signal between the drain and the source of the second transistor.

17. The method of claim 16, wherein an amount of the voltage signal at the gate of the second transistor is based on an amount of energy associated with the voltage signal dissipated by the second resistor and an amount of energy associated with the voltage signal stored by the second capacitor after the dissipation.

18. The method of claim 16, wherein the amount of the output current signal flowing through the second transistor is based on an amount of energy associated with the output current signal dissipated by the third resistor.

19. The method of claim 15, wherein a size of the second transistor is n times a size of the first transistor, where n is a real number.

20. The method of claim 15, wherein a value of the first resistor is n times a value of the third resistor, where n is a real number.

21. An apparatus for linearizing a baseband filter, comprising:

first conducting means for receiving a first current signal;

converting means for receiving a second current signal, generating a voltage signal based on the second current signal, and applying the voltage signal to the first conducting means, wherein an amount of the second current signal received by the converting means is based on an amount of the first current signal flowing through the first conducting means; and second conducting means for controlling an output current signal based on the voltage signal, wherein the output current signal is controlled to be a linear replica of the first current signal for in-band frequencies.

22. The apparatus of claim 21, wherein the converting means comprises a biquadratic amplifier and the first conducting means comprises a first capacitor, a first resistor, and a first transistor configured to operate based on the voltage signal from the biquadratic amplifier, wherein a non-inverting input of the biquadratic amplifier is coupled to a current source, wherein a drain of the first transistor is coupled to the current source, a gate of the first transistor is coupled to an output of the biquadratic amplifier, and a source of the first transistor is coupled to a first node of the first capacitor and a first node of the first resistor, and wherein a second node of the first capacitor and a second node of the first resistor are coupled to a ground node.

23. The apparatus of claim 22, wherein when the first transistor operates based on the voltage signal from the biquadratic amplifier, the first transistor is configured to flow the first current signal from the drain to the source of the first transistor toward the first capacitor and the first resistor, and wherein the amount of the first current signal flowing through the first transistor is based on an amount of energy associated with the first current signal stored by the first capacitor and an amount of energy associated with the first current signal dissipated by the first resistor.

24. The apparatus of claim 23, wherein, at a frequency higher than a highest in-band frequency, the amount of the first current signal flowing through the first transistor reduces the amount of the second current signal received by the biquadratic amplifier.

25. The apparatus of claim 22, wherein the second conducting means comprises a second resistor, a second capacitor, a third resistor, and a second transistor, wherein a first node of the second resistor is coupled to the output of the biquadratic amplifier and the gate of the first transistor, and a second node of the second resistor is coupled to a first node of the second capacitor and a gate of the second transistor, wherein the first node of the second capacitor is coupled to the second node of the second resistor and the gate of the second transistor, and a second node of the second capacitor is coupled to the ground node, wherein a first node of the third resistor is coupled to a source of the second transistor, and a second node of the third resistor is coupled to the ground node, wherein the source of the second transistor is coupled to the first node of the third resistor, and wherein the output current signal flows through a drain of the second transistor.

26. The apparatus of claim 25, wherein the output current signal is controlled to be the linear replica of the first current signal by:

the biquadratic amplifier flowing the voltage signal across the second resistor to be applied to the gate of the second transistor, and the second transistor operating based on the voltage signal applied to the gate of the second transistor and flowing the output current signal between the drain and the source of the second transistor.

27. The apparatus of claim 26, wherein an amount of the voltage signal at the gate of the second transistor is based on an amount of energy associated with the voltage signal dissipated by the second resistor and an amount of energy associated with the voltage signal stored by the second capacitor after the dissipation.

28. The apparatus of claim 26, wherein the amount of the output current signal flowing through the second transistor is based on an amount of energy associated with the output current signal dissipated by the third resistor.

29. The apparatus of claim 25, wherein a size of the second transistor is n times a size of the first transistor, where n is a real number.

30. The apparatus of claim 25, wherein a value of the first resistor is n times a value of the third resistor, where n is a real number.

* * * * *